(12) United States Patent
Huang et al.

(10) Patent No.: US 8,779,739 B2
(45) Date of Patent: Jul. 15, 2014

(54) INTEGRATED DC CONVERTER WITH IMPROVED DRIVING STAGE

(71) Applicants: Global Unichip Corporation, Hsinchu (TW); Taiwan Semiconductor Manufacturing Co., Ltd., Hsin-Chu (TW)

(72) Inventors: Chao-Yen Huang, Taipei (TW); Jung-Tsun Chuang, Tainan (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 2 days.

(21) Appl. No.: 13/759,153

(22) Filed: Feb. 5, 2013

(65) Prior Publication Data

US 2013/0214749 A1    Aug. 22, 2013

(30) Foreign Application Priority Data

Feb. 20, 2012 (TW) .............................. 101105535 A

(51) Int. Cl.
*G05F 1/00* (2006.01)
*H03B 1/00* (2006.01)

(52) U.S. Cl.
USPC .......................................... 323/282; 327/108

(58) Field of Classification Search
CPC ................................. G05F 1/563; G05F 1/595
USPC ........................... 323/271, 282; 327/108, 112
See application file for complete search history.

(56) References Cited

U.S. PATENT DOCUMENTS

| | | | |
|---|---|---|---|
| 7,649,384 B2 * | 1/2010 | Ho et al. | 326/83 |
| 8,212,536 B2 * | 7/2012 | Burns et al. | 323/224 |
| 8,237,422 B2 * | 8/2012 | Singh et al. | 323/282 |
| 8,593,128 B2 * | 11/2013 | Burns et al. | 323/288 |
| 8,633,737 B2 * | 1/2014 | Wang et al. | 327/108 |

* cited by examiner

*Primary Examiner* — Adolf Berhane
*Assistant Examiner* — Emily P Pham
(74) *Attorney, Agent, or Firm* — WPAT, PC; Justin King

(57) ABSTRACT

A DC converter is provided for converting a first supply voltage into a second supply voltage. The first supply voltage is higher than the second supply voltage. The DC converter includes a driving stage and an output stage. The driving stage includes a modulation circuit, a pull-up driving unit, a pull-up unit, a pull-down driving unit, and a pull-down unit. The modulation circuit generates a control signal according to the second supply voltage. The pull-up driving unit generates a first P-type driving signal and a second P-type driving signal to the pull-up unit according to the control signal. The pull-down driving unit generates a first N-type driving signal and a second N-type driving signal to the pull-down unit according to the control signal.

14 Claims, 10 Drawing Sheets

US 8,779,739 B2

INTEGRATED DC CONVERTER WITH IMPROVED DRIVING STAGE

This application claims the benefit of Taiwan Patent Application No. 101105535, filed Feb. 20, 2012, the subject matter of which is incorporated herein by reference.

FIELD OF THE INVENTION

The present invention relates to a converter, and more particularly to a DC converter.

BACKGROUND OF THE INVENTION

In various electronic products, an integrated circuit chip (IC chip) is cooperatively used with other components. As known, the core voltage Vcore and the input/output voltage Vio of the IC chip are often different. Generally, a DC converter is employed to provide various DC voltages for the core circuit and the input/output circuit of the IC chip.

FIG. 1A is a schematic circuit diagram illustrating a conventional DC converter. As shown in FIG. 1A, the conventional DC converter 101 includes a driving stage 100 and an output stage 109. The driving stage 100 includes a driving circuit 104, a feedback pulse width modulation controller (also referred as a feedback PWM controller) 105, a voltage divider (R1, R2), a P-type power MOS transistor (P), and an N-type power MOS transistor (N). The output stage 109 includes an inductor L and a capacitor C.

The P-type power MOS transistor (P) and the N-type power MOS transistor (N) are electrically connected between the input/output voltage Vio and a ground terminal GND. The driving circuit 104 may issue two driving signals Sp and Sn to the gate terminals of the P-type power MOS transistor (P) and the N-type power MOS transistor (N), respectively. The inductor L is electrically connected between the drain terminals of the P-type power MOS transistor (P) and the N-type power MOS transistor (N), and the core voltage output terminal Vcore. The capacitor C and the voltage divider are both electrically connected between the core voltage output terminal Vcore and the ground terminal GND. The voltage divider is composed of two resistors R1 and R2. In addition, the voltage divider is used for providing a divided voltage Vd to the feedback PWM controller 105. Moreover, the feedback PWM controller 105 is used for providing a control signal Sc to the driving circuit 104. According to the control signal Sc, the pulse widths of the two driving signals Sp and Sn are modulated in order to stabilize the core voltage Vcore.

Take a system on chip (SOC) for example. The input/output voltage Vio received by the system on chip is 3.3V, and the core voltage Vcore received by the system on chip is 1.8V. Since the input/output voltage Vio and the core voltage Vcore are different, a DC converter is required to generate the core voltage Vcore.

FIG. 1B is a schematic circuit diagram illustrating an external power supply system for a conventional system on chip. As shown in FIG. 1B, the SOC 20 includes a core circuit 11 and an input/output circuit 13. A DC converter 15 is located outside the SOC 20. The configurations of the DC converter 15 are similar to those of the DC converter 101.

The actions of the DC converter 15 and the input/output circuit 13 of the SOC 20 are determined according to the input/output voltage Vio. According to the input/output voltage Vio, the DC converter 15 generates the core voltage Vcore to the core circuit 11. Therefore, the SOC 20 is operated according to the input/output voltage Vio and the core voltage Vcore.

As known, the SOC 20 is employed to integrate all circuits into a single chip. If the DC converter 15 is located outside the SOC 20, the fabricating cost will be increased.

In view of cost-effectiveness, it is important to integrate the DC converter into the SOC. FIG. 1C is a schematic circuit diagram illustrating the integration of a DC converter into a system on chip. As shown in FIG. 1C, the core circuit 113, the input/output circuit 116 and the driving stage 100 of the DC converter 112 are integrated into the SOC 10. However, since the output stage 119 of the DC converter 112 fails to be integrated into the SOC 10, the inductor L and the capacitor C need to be externally electrically connected to the SOC 10. The operating principles of the DC converter 112 are similar to those of the DC converter 101 of FIG. 1A, and are not redundantly described herein.

Moreover, for integrating the driving stage 100 into the SOC 10, the voltage-withstanding capability of the power MOS transistor should be taken into consideration. Since the core circuit 113 and the input/output circuit 116 are designed to be compatible with the CMOS semiconductor logic circuit fabrication process, the MOS transistors thereof are all low voltage-stress MOS transistors. For example, the low voltage-stress MOS transistor is designed to withstand a voltage of 1.8V.

However, as shown in FIG. 1C, the P-type power MOS transistor (P) and the N-type power MOS transistor (N) of the driving stage 110 should withstand a higher voltage (e.g. 3.3V). Consequently, for producing the SOC 10, the CMOS semiconductor logic circuit fabrication process and an additional deep n-well process are necessary to fabricate the high voltage-stress MOS transistor. Under this circumstance, the fabricating cost of the SOC 10 is still high.

Therefore, there is a need of providing an improved driving stage of the DC converter by using a fabrication process compatible with the CMOS semiconductor logic circuit fabrication process.

SUMMARY OF THE INVENTION

An embodiment of the present invention provides a DC converter for converting a first supply voltage into a second supply voltage. The first supply voltage is higher than the second supply voltage. The DC converter includes a driving stage and an output stage. The driving stage includes a modulation circuit, a pull-up driving unit, and a pull-up unit. The modulation circuit generates a control signal according to the second supply voltage. The pull-up driving unit generates a first P-type driving signal and a second P-type driving signal according to the control signal. The pull-up unit includes a first P-type transistor and a second P-type transistor. The second P-type transistor has a source terminal electrically connected to the first supply voltage, and a gate terminal receiving the second P-type driving signal. The first P-type transistor has a source terminal electrically connected to a drain terminal of the second P-type transistor, a gate terminal receiving the first P-type driving signal, and a drain terminal electrically connected to a driving stage output terminal. The output stage is used for generating the second supply voltage according to an output voltage of the driving stage output terminal. During a transient period of switching the output voltage of the driving stage output terminal from a third supply voltage to the first supply voltage, the first P-type driving signal is decreased from a first bias voltage to a second bias voltage, wherein during a stable period after the transient period, the first P-type driving signal is restored to the first bias voltage.

Another embodiment of the present invention provides a DC converter for converting a first supply voltage into a second supply voltage. The first supply voltage is higher than the second supply voltage. The DC converter includes a driving stage and an output stage. The driving stage includes a modulation circuit, a pull-down driving unit, and a pull-down unit. The modulation circuit generates a control signal according to the second supply voltage. The pull-down driving unit generates a first N-type driving signal and a second N-type driving signal according to the control signal. The pull-down unit includes a first N-type transistor and a second N-type transistor. The second N-type transistor has a source terminal electrically connected to a third supply voltage, and a gate terminal receiving the second N-type driving signal. The first N-type transistor has a source terminal electrically connected to a drain terminal of the second N-type transistor, a gate terminal receiving the first N-type driving signal, and a drain terminal electrically connected to a driving stage output terminal. The output stage is used for generating the second supply voltage according to an output voltage of the driving stage output terminal. During a transient period of switching the output voltage of the driving stage output terminal from the third supply voltage to the third supply voltage, the first N-type driving signal is increased from a first bias voltage to a third bias voltage, wherein during a stable period after the transient period, the first N-type driving signal is restored to the first bias voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
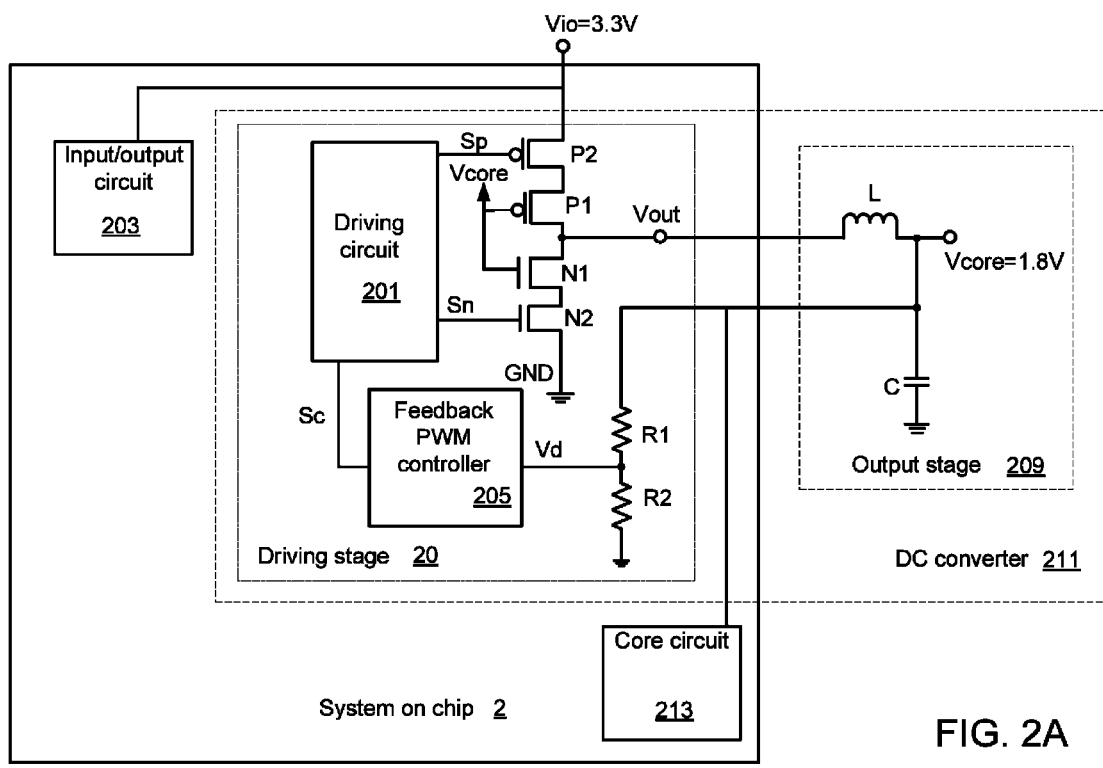
FIG. 2A is a schematic circuit diagram illustrating a DC converter according to an embodiment of the present invention, in which the driving stage of the DC converter is integrated into a system on chip.

FIG. 2A is a schematic circuit diagram illustrating a DC converter according to an embodiment of the present invention, in which the driving stage of the DC converter is integrated into a system on chip. Since the MOS transistor produced by the CMOS semiconductor logic circuit fabrication process is only able to withstand a lower voltage, two low voltage-stress MOS transistors in a cascode configuration are used to replace the conventional power MOS.

As shown in FIG. 2A, the SOC 2 includes a core circuit 213, an input/output circuit 203, and a driving stage 20 of the DC converter 211. Moreover, an output voltage 209 of the DC converter 211 includes an inductor L and a capacitor C, which are externally electrically connected to the SOC 2.

Figure 1A:
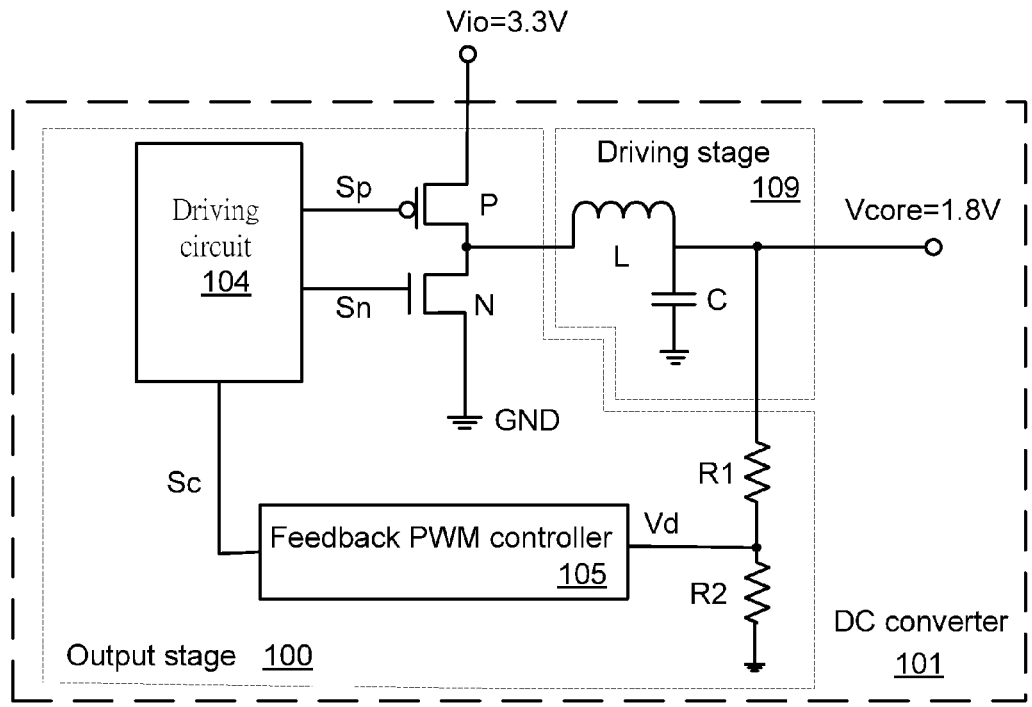
FIG. 1A (prior art) is a schematic circuit diagram illustrating a conventional DC converter.
Figure 1B:
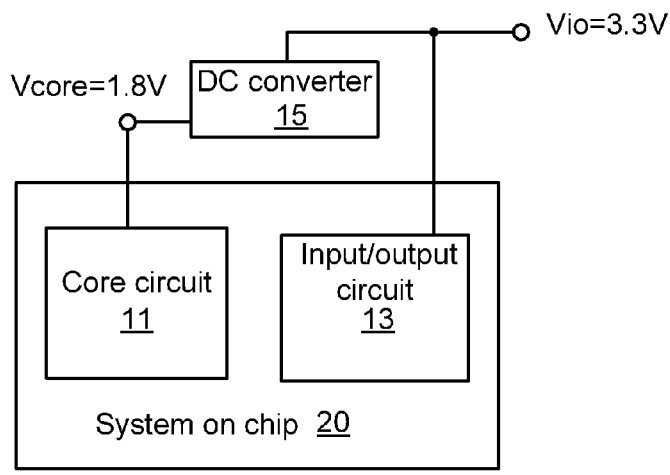
FIG. 1B (prior art) is a schematic circuit diagram illustrating an external power supply system for a conventional system on chip.
Figure 1C:
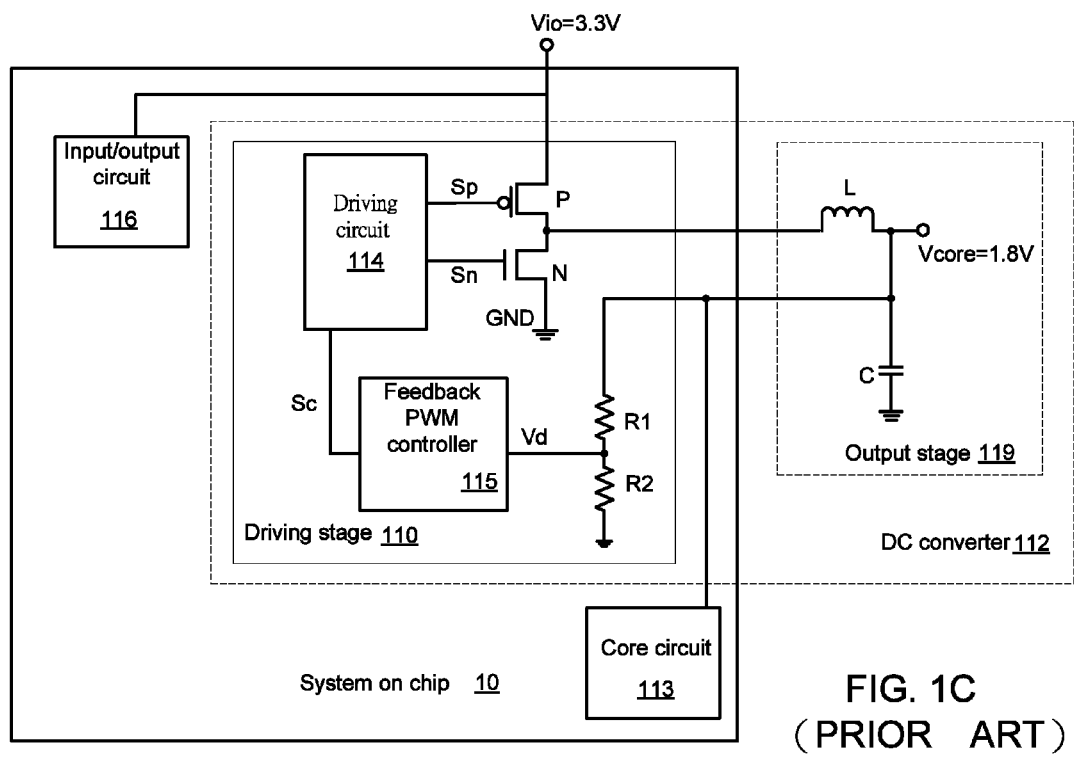
FIG. 1C (prior art) is a schematic circuit diagram illustrating the integration of a DC converter into a system on chip.

In comparison with the driving stage of FIG. 1C, a first P-type transistor P1 and a second P-type transistor P2 in a cascode configuration are used as a pull-up unit of the driving stage 20 of the DC converter 211 to replace the P-type power MOS transistor; and a first N-type transistor N1 and a second N-type transistor N2 in a cascode configuration are used as a pull-down unit to replace the N-type power MOS transistor. In this embodiment, the first P-type transistor P1, the second P-type transistor P2, the first N-type transistor N1 and the second N-type transistor N2 are low voltage-stress MOS transistors, which are produced by a CMOS semiconductor logic circuit fabrication process and can withstand a low voltage (e.g. 1.8V).

Obviously, the first P-type transistor P1 and the second P-type transistor P2 in the cascode configuration can withstand a total voltage of at least 3.6V, which is higher than the input/output voltage Vio. Similarly, the first N-type transistor N1 and the second N-type transistor N2 in the cascode configuration can withstand a total voltage of at least 3.6V, which is higher than the input/output voltage Vio. In other words, the driving stage of the DC converter as shown in FIG. 2A is sufficient to withstand a higher voltage. The operating principles of the driving circuit 201, the feedback PWM controller 205 and the voltage divider are similar to those of the conventional driving stage, and are not redundantly described herein.

Please refer to FIG. 2A again. The second P-type transistor P2 has a source terminal electrically connected to the input/output voltage Vio, and a gate terminal receiving a first driving signal Sp from the driving circuit 201. The first P-type transistor P1 has a source terminal electrically connected to a drain terminal of the second P-type transistor P2, a gate terminal electrically connected to a core voltage Vcore, and a drain terminal electrically connected to a driving stage output terminal Vout.

The second N-type transistor N2 has a source terminal electrically connected to a ground terminal GND, and a gate terminal receiving a second driving signal Sn from the driving circuit 201. The first N-type transistor N1 has a source terminal electrically connected to a drain terminal of the second N-type transistor N2, a gate terminal electrically connected to the core voltage Vcore, and a drain terminal electrically connected to the driving stage output terminal Vout. In this embodiment, the input/output voltage Vio is higher than the core voltage Vcore. For example, the input/output voltage Vio is 3.3V, and the core voltage Vcore is 1.8V.

Since the gate terminal of the first P-type transistor P1 and the gate terminal of the first N-type transistor N1 are both electrically connected to the core voltage Vcore, the first P-type transistor P1 and the first N-type transistor N1 may be considered to be in the on state. Moreover, the feedback PWM controller 205 is used for providing a control signal Sc to the driving circuit 201. According to the control signal Sc, the pulse widths of the first driving signal Sp and the second driving signal Sn are modulated in order to stably output the core voltage Vcore.

However, since the gate terminal of the first P-type transistor P1 and the gate terminal of the first N-type transistor N1 are both electrically connected to the core voltage Vcore, the first P-type transistor P1 and the first N-type transistor N1 are not completely turned on. If the response speed of the first P-type transistor P1 or the first N-type transistor N1 is too is slow, the first P-type transistor P1 or the first N-type transistor N1 is possibly damaged. The reasons of resulting in damage of the first P-type transistor P1 will be illustrated in more details as follows.

Figure 2B:
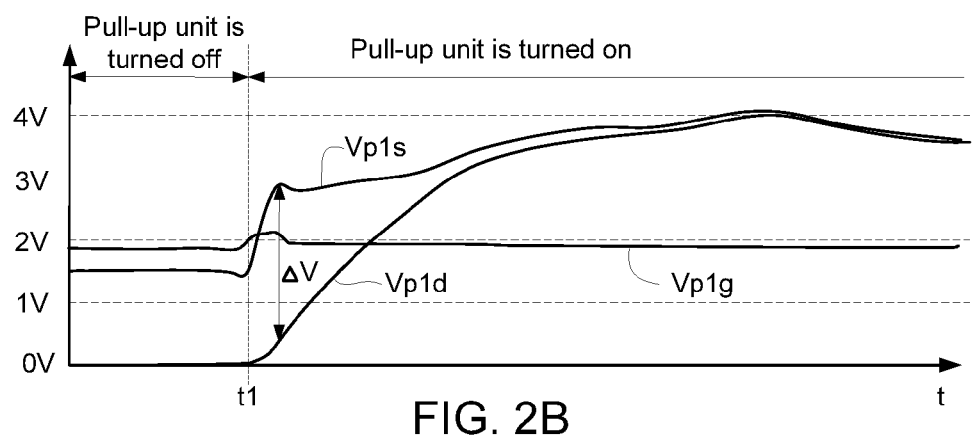
FIG. 2B is a plot illustrating the bias voltages at various terminals of the first P-type transistor P1 of the pull-up unit of the driving stage of FIG. 2A when the pull-up unit is switched from an on state to an off state.

FIG. 2B is a plot illustrating the bias voltages at various terminals of the first P-type transistor P1 of the pull-up unit of the driving stage of FIG. 2A when the pull-up unit is switched from an on state to an off state.

Before the time point t1, the pull-up unit is turned off (i.e. the second P-type transistor P2 is turned off), and the pull-down unit is turned on (i.e. the second N-type transistor N2 is turned on). Consequently, the gate voltage (Vp1g) of the first P-type transistor P1 is continuously maintained at the first source voltage V1 (1.8V). Since the drain terminal of the first P-type transistor P1 is electrically connected to the driving stage output terminal Vout, the drain voltage (Vp1d) of the first P-type transistor P1 is 0V. Since the source terminal of the first P-type transistor P1 is in a floating state, the source voltage (Vp1s) of the first P-type transistor P1 is about 1.5V.

At the time point t1, the pull-up unit is turned on (i.e. the second P-type transistor P2 is turned on) and the pull-down unit is turned off (i.e. the second N-type transistor N2 is turned off). Since the P-type transistors of the pull-up unit are turned on, the driving stage output voltage Vout starts to rise. After the time point t1, the voltage (Vp1d) at the drain terminal of the first P-type transistor P1 and the source voltage (Vp1s) of the first P-type transistor P1 are gradually increased to be equal to the input/output voltage Vio (3.3V). In addition, since the gate terminal of the first P-type transistor P1 is electrically connected with the core voltage Vcore, the gate voltage (Vp1g) of the first P-type transistor P1 is still maintained at 1.8V.

Please refer to FIG. 2B again. During the driving stage output voltage Vout (i.e. the drain voltage (Vp1d) at the drain terminal of the first P-type transistor P1) is switched from a low level (0V) to a high level (3.3V), the source voltage (Vp1s) of the first P-type transistor P1 is increased at a higher speed, and the drain voltage (Vp1d) is increased at a lower speed. Consequently, during the transient period of rising the driving stage output voltage Vout, the voltage difference (ΔV) between the source voltage (Vp1s) and the drain voltage (Vp1d) of the first P-type transistor P1 may be higher than the allowable voltage (e.g. 1.8V) that can be withstood by the first P-type transistor P1. Under this circumstance, the first P-type transistor P1 is possibly damaged, and thus the overall circuitry becomes abnormal.

Similarly, during the driving stage output voltage Vout is switched from the high level (3.3V) to the low level (0V), the voltage difference (ΔV) between the drain voltage and the source voltage of the first N-type transistor N1 may be higher than the allowable voltage that can be withstood by the first N-type transistor N1. Under this circumstance, the first N-type transistor N1 is possibly damaged From the above discussions in FIGS. 2A and 2B, during the operations of the first driving signal Sp and the second driving signal Sn, the voltage difference between the drain voltage and the source voltage of the first P-type transistor P1 or the first N-type transistor N1 may be higher than the withstandable voltage. Under this circumstance, the first P-type transistor P1 or the first N-type transistor N1 is possibly damaged.

Figure 3A:
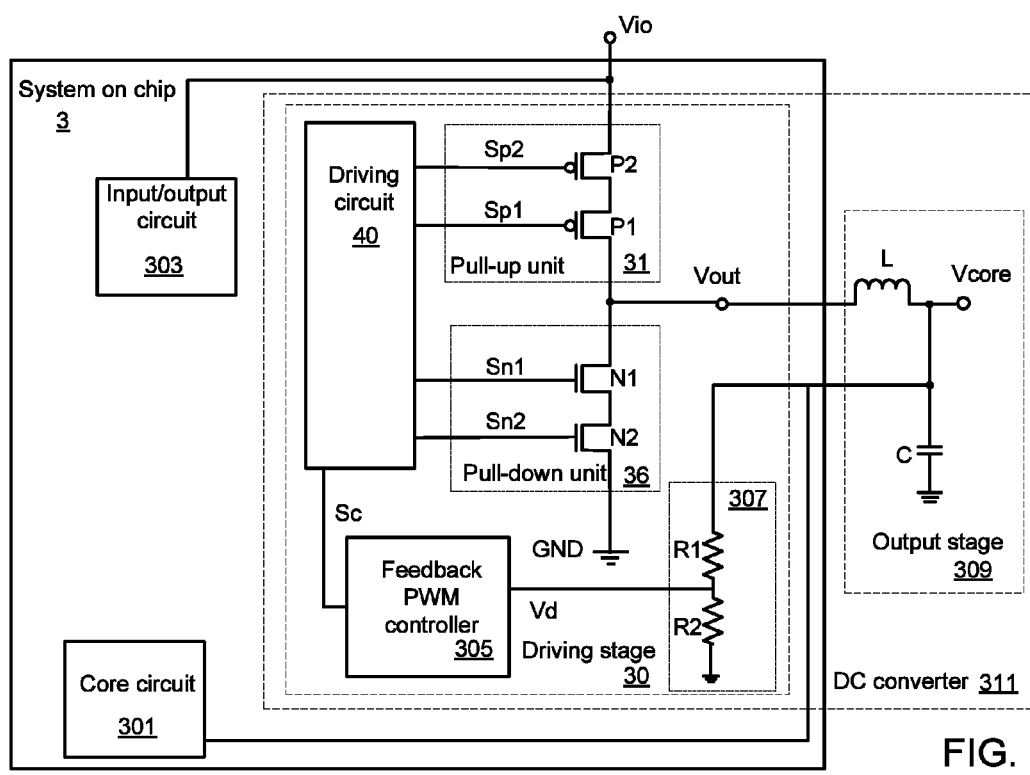
FIG. 3A is a schematic circuit diagram illustrating a DC converter according to another embodiment of the present invention, in which the driving stage of the DC converter is integrated into a system on chip.

FIG. 3A is a schematic circuit diagram illustrating a DC converter according to another embodiment of the present invention, in which the driving stage of the DC converter is integrated into a system on chip. As shown in FIG. 3A, the SOC 3 includes a core circuit 301, an input/output circuit 303, and a driving stage 30 of the DC converter 311. Moreover, an output voltage 309 of the DC converter 311 includes an inductor L and a capacitor C, which are externally electrically connected to the SOC 3.

In the SOC 3, the input/output voltage Vio is used as a first supply voltage for the input/output circuit 303, the core voltage Vcore is used as a second supply voltage for the core circuit 301, and the ground voltage GND is used as a third supply voltage. By the DC converter 311, the input/output voltage Vio (i.e. the first supply voltage) is converted into the core voltage Vcore (i.e. the second supply voltage), wherein the first supply voltage is higher than the second supply voltage.

In comparison with FIG. 2A, the core voltage Vcore is not received by the gate terminals of the first P-type transistor P1 and the first N-type transistor N1 of the driving stage of FIG. 3A. As shown in FIG. 3A, the driving stage 30 includes a driving circuit 40, a pull-up unit 31, a pull-down unit 36, a voltage divider 307, and a feedback PWM controller 305. By the driving circuit 40, a first P-type driving signal Sp1 is issued to the gate terminal of the first P-type transistor P1, a second P-type driving signal Sp2 is issued to the gate terminal of the second P-type transistor P2, a first N-type driving signal Sn1 is issued to the gate terminal of the first N-type transistor N1, and a second N-type driving signal Sn2 is issued to the gate terminal of the second N-type transistor N2.

In this embodiment, the first P-type transistor P1, the second P-type transistor P2, the first N-type transistor N1 and the second N-type transistor N2 are low voltage-stress MOS transistors, which are produced by a CMOS semiconductor logic circuit fabrication process and can withstand a low voltage (e.g. 1.8V). The operating principles of the feedback PWM controller 305 and the voltage divider 307 are similar to those of the driving stage of FIG. 2A, and are not redundantly described herein.

Under control of the driving circuit 40, the second P-type driving signal Sp2 received by the second P-type transistor P2 and the second N-type driving signal Sn2 received by the second N-type transistor N2 are logic signals. Under control of the driving circuit 40, the first P-type driving signal Sp1 received by the first P-type transistor P1, and the second N-type driving signal Sn2 received by the second N-type transistor N2 are non-logic signals and their voltages are not constantly maintained.

Figure 3B:
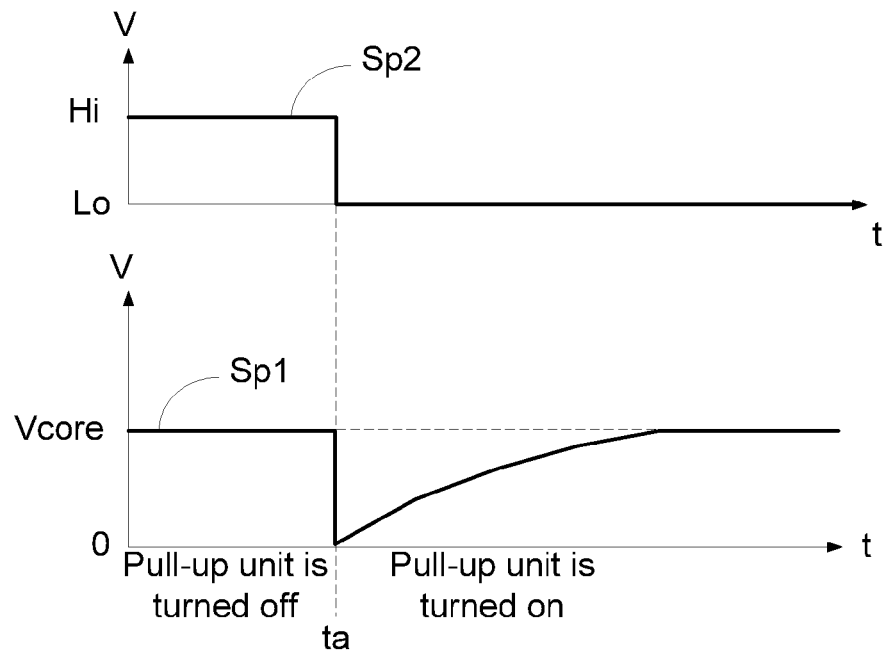
FIG. 3B is a plot illustrating the first P-type driving signal Sp1 and the second P-type driving signal Sp2 of the pull-up unit of the driving stage of FIG. 3A when the pull-up unit is switched from an on state to an off state.

FIG. 3B is a plot illustrating the first P-type driving signal Sp1 and the second P-type driving signal Sp2 of the pull-up unit of the driving stage of FIG. 3A when the pull-up unit is switched from an on state to an off state.

Before the time point ta, the second P-type driving signal Sp2 is at a high logic-level state (Hi), and the first P-type driving signal Sp1 is maintained at a first bias voltage (e.g. the core voltage Vcore). Meanwhile, the first P-type transistor P1 is turned on and the second P-type transistor P2 is tuned off, so that the pull-up unit 31 is turned off.

After the time point ta, the second P-type driving signal Sp2 is switched from the high logic-level state (Hi) to a low logic-level state (Lo). The first P-type driving signal Sp1 is abruptly decreased from the first bias voltage to the second bias voltage (e.g. the ground voltage) at the time point ta, and then gradually increased to the first bias voltage (e.g. the core voltage Vcore). Meanwhile, the first P-type transistor P1 and the second P-type transistor P2 are completely turned on, so that the response speeds of the first P-type transistor P1 and the second P-type transistor P2 are increased.

Figure 3C:
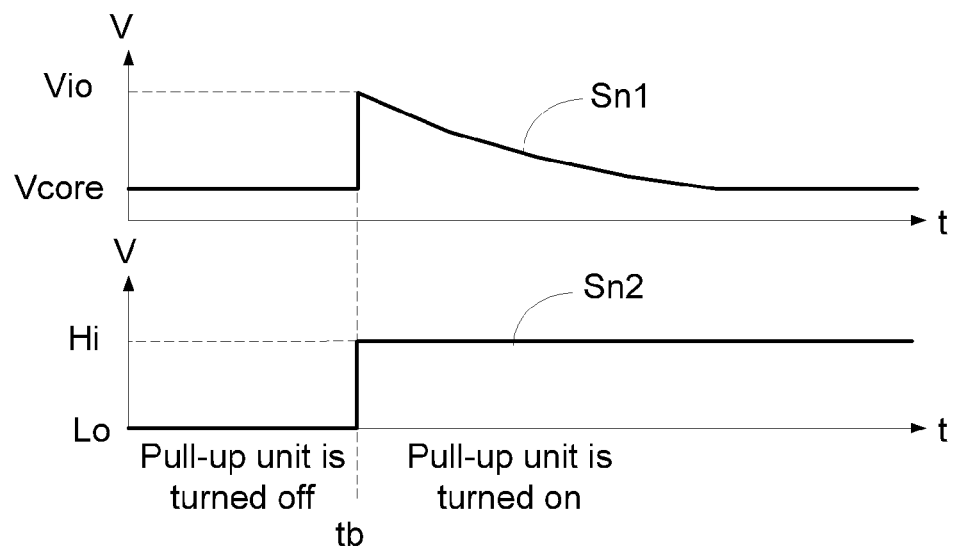
FIG. 3C is a plot illustrating the first N-type driving signal Sn1 and the second N-type driving signal Sn2 of the pull-down unit of the driving stage of FIG. 3A when the pull-up unit is switched from an off state to an on state.

FIG. 3C is a plot illustrating the first N-type driving signal Sn1 and the second N-type driving signal Sn2 of the pull-down unit of the driving stage of FIG. 3A when the pull-up unit is switched from an off state to an on state.

Before the time point tb, the second N-type driving signal Sn2 is at a low logic-level state (Lo), and the first N-type driving signal Sn1 is maintained at a first bias voltage (e.g. the core voltage Vcore). Meanwhile, the first N-type transistor N1 is turned on and the second N-type transistor N2 is tuned off, so that the pull-down unit 36 is turned off.

After the time point tb, the second N-type driving signal Sn2 is switched from the low logic-level state (Lo) to a high logic-level state (Hi). The first N-type driving signal Sn1 is abruptly increased to a third bias voltage (e.g. the input/output voltage Vio) at the time point tb, and then gradually decreased to the first bias voltage (e.g. the core voltage Vcore). Meanwhile, the first N-type transistor N1 and the second N-type transistor N2 are completely turned on, so that the response speeds of the first N-type transistor N1 and the second N-type transistor N2 are increased.

Figure 3D:
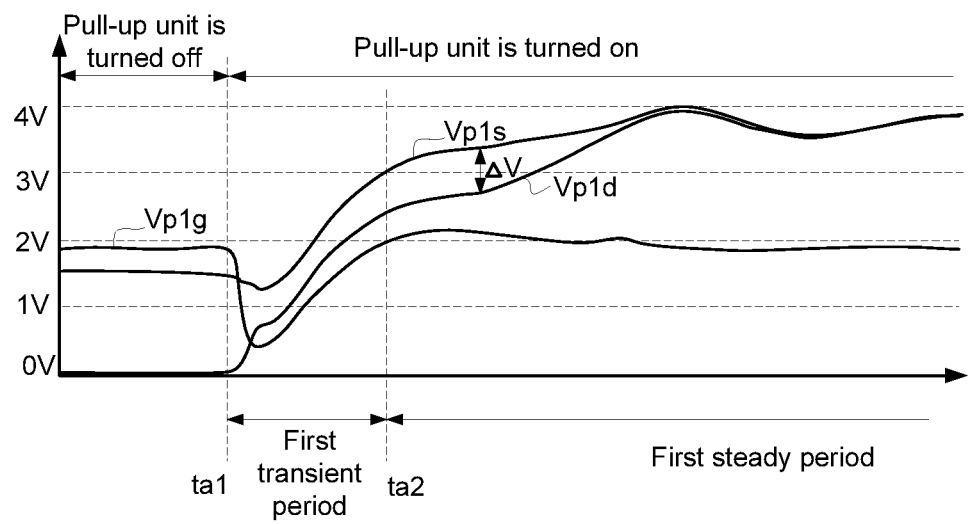
FIG. 3D is a plot illustrating the bias voltages at various terminals of the first P-type transistor P1 of the pull-up unit of the driving stage of FIG. 3A when the pull-up unit is switched from an on state to an off state.

FIG. 3D is a plot illustrating the bias voltages at various terminals of the first P-type transistor P1 of the pull-up unit of the driving stage of FIG. 3A In a case that the driving stage output terminal Vout is switched from the low voltage-level state to the high voltage-level state, the voltage changes of the bias voltages at various terminals of the first P-type transistor P1 during a transient period and a stable period are shown in FIG. 3D.

Before the time point t1, the pull-down unit 36 is turned on, and the pull-up unit 31 is turned off. Consequently, the gate voltage (Vp1g) of the first P-type transistor P1 (i.e. the first P-type driving signal Sp1) is continuously maintained at the core voltage Vcore (1.8V). Since the drain terminal of the first P-type transistor P1 is electrically connected to the driving stage output terminal Vout and the pull-down unit 36 is turned on (i.e. the first N-type transistor N1 and the second N-type transistor N2 are turned on), the drain voltage (Vp1d) of the first P-type transistor P1 is 0V. Since the source terminal of the first P-type transistor P1 is in a floating state, the source voltage (Vp1s) of the first P-type transistor P1 is about 1.5V.

At the time point ta1, the pull-up unit 31 is turned on. Consequently, the driving stage output voltage Vout (i.e. the drain voltage (Vp1d) of the first P-type transistor P1) starts to rise. During the first transient period from the time point ta1 to the time point ta2, the gate voltage (Vp1g) of the first P-type transistor P1 (i.e. the first P-type driving signal Sp1) is firstly decrease from the first bias voltage (e.g. the core voltage Vcore) to the second bias voltage (e.g. the ground voltage GND) and then gradually increased to the first bias voltage.

Consequently, the first P-type transistor P1 is conducted. Since the first P-type transistor P1 is completely turned on, the response speed of the first P-type transistor P1 is increased. Under this circumstance, the drain voltage and the source voltage of the first P-type transistor P1 are increased substantially at the same speed. Since the voltage difference (ΔV) between the source voltage (Vp1s) and the drain voltage (Vp1d) of the first P-type transistor P1 is not too high, the possibility of damaging the first P-type transistor P1 will be minimized.

During the first stable period after the time point ta2, the first P-type driving signal Sp1 received by the gate terminal of the first P-type transistor P1 is restored to the first bias voltage. During the first stable period, as shown in FIG. 3D, the source voltage (Vp1s) and the drain voltage (Vp1d) of the first P-type transistor P1 are increased to the input/output voltage Vio (Vio=3.3V).

Please refer to FIG. 3D again. During the pull-up unit is turned on, the voltage difference between any two terminals of the first P-type transistor P1 is not higher than the withstandable voltage (1.8V). Consequently, the driving stage of FIG. 3A is effective to protect the first P-type transistor P1. Similarly, since the voltage difference between any two terminals of the first N-type transistor N1 is not higher than the withstandable voltage (1.8V), the driving stage of FIG. 3A is effective to protect the first N-type transistor N1.

From the above discussions, in the driving stage of the DC converter of the present invention, the P-type transistors and the N-type transistors of the are arranged in the cascode configurations, and the driving signals are controlled by the driving circuit 40 in the controlling manner as shown in FIGS. 3B and 3C. In such way, the transistors of the pull-up unit 31 and the pull-down unit 36 are not damaged.

Figure 4:
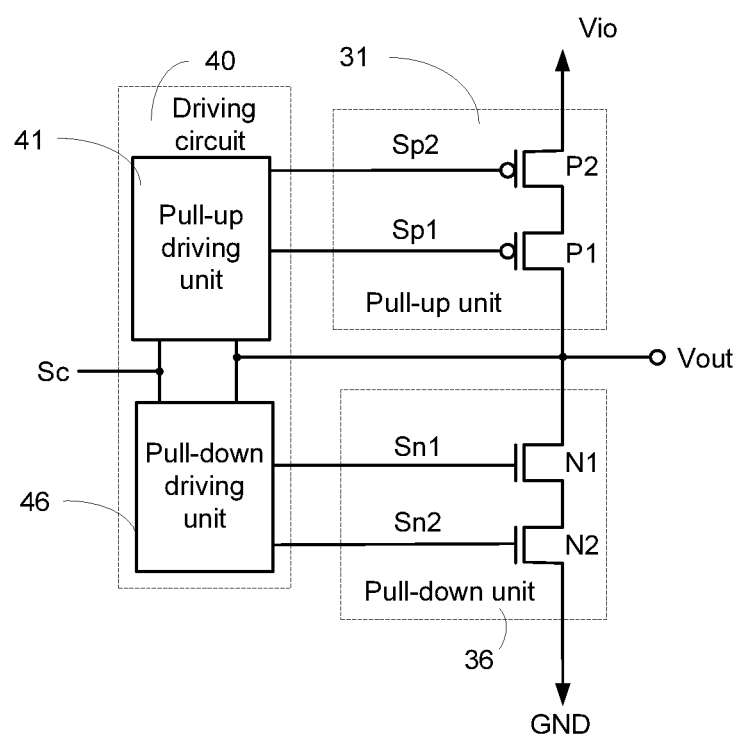
FIG. 4 is a schematic circuit diagram illustrating the relationship between the driving stage, the pull-up unit and the pull-down unit of a DC converter according to an embodiment of the present invention.

FIG. 4 is a schematic circuit diagram illustrating the relationship between the driving stage, the pull-up unit and the pull-down unit of a DC converter according to an embodiment of the present invention. As shown in FIG. 4, the driving circuit 40 further includes a pull-up driving unit 41 and a pull-down driving unit 46.

The pull-up driving unit 41 is electrically connected with the pull-up unit 31, and the pull-down driving unit 46 is electrically connected with the pull-down unit 36. The first P-type transistor P1 and the second P-type transistor P2 of the pull-up unit 31 are arranged in the cascode configuration. The first N-type transistor N1 and the second N-type transistor N2 of the pull-down unit 36 are arranged in the cascode configuration.

According to the control signal Sc from the feedback PWM controller 305, the pull-up driving unit 41 issues the first P-type driving signal Sp1 and the second P-type driving signal Sp2 to the first P-type transistor P1 and the second P-type transistor P2 of the pull-up unit 31, respectively.

Similarly, according to the control signal Sc from the feedback PWM controller 305, the pull-down driving unit 46 issues the first N-type driving signal Sn1 and the second N-type driving signal Sn2 to the first N-type transistor N1 and the second N-type transistor N2 of the pull-down unit 36, respectively.

The operations of the pull-up unit 31 will be illustrated as follows. Before the time point ta1, the first P-type transistor P1 is turned on, and the second P-type transistor P2 is turned off. Consequently, the pull-up unit 31 is still turned off. Then, during the first transient period, from the time point ta1 to the time point ta2, the pull-up driving unit 41 provides a pull-up transient path. According to the driving stage output voltage Vout, the pull-up driving unit 41 generates the first P-type driving signal Sp1. During the first stable period after the time point ta2, a first bias voltage is provided from the pull-up driving unit 41 to the gate terminal of the first P-type transistor P1 to be served as the first P-type driving signal Sp1. For example, the first bias voltage is equal to the core voltage Vcore (1.8V).

Similarly, the pull-down unit 36 may be operated during a second transient period and a second stable period. Before the second transient period, the first N-type transistor N1 is turned on and the second N-type transistor N2 is turned off. Consequently, the pull-down unit 36 is turned off. Then, during the second transient period, the pull-down driving unit 46 provides a pull-down transient path. According to the driving stage output voltage Vout, the pull-down driving unit 46 generates the first N-type driving signal Sn1. Moreover, during the second stable period after the second transient period, a first bias voltage is provided from the pull-down unit 36 to the gate terminal of the first N-type transistor N1 to be served as the first N-type driving signal Sn1.

Figure 5A:
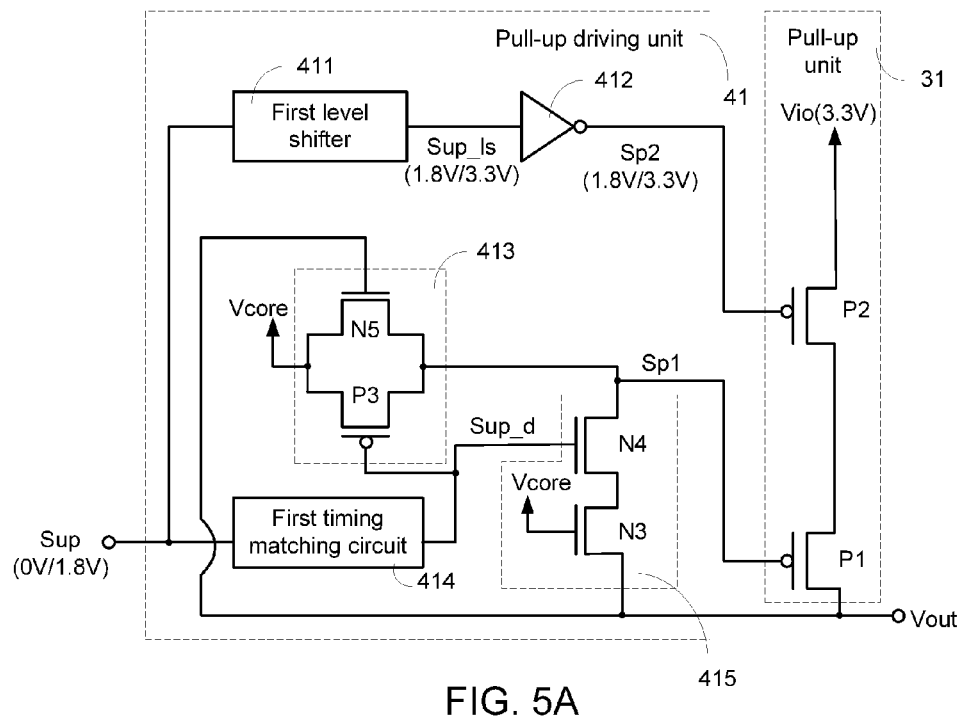
FIG. 5A is a schematic circuit diagram illustrating the pull-up driving unit and the pull-up unit of a DC converter according to an embodiment of the present invention.

FIG. 5A is a schematic circuit diagram illustrating the pull-up driving unit and the pull-up unit of a DC converter according to an embodiment of the present invention. As shown in FIG. 5A, the pull-up driving unit 41 includes a first level shifter 411, a first inverter 412, a first transmission gate 413, a first timing matching circuit 414, and a pull-up transient path 415.

The first level shifter 411 is used for receiving a pull-up driving signal Sup, which is generated according to the control signal Sc. The voltage level of the pull-up driving signal Sup is 0V or 1.8V. By the first level shifter 411, the pull-up driving signal Sup is converted into a pull-up converted output signal Sup_Is. The pull-up converted output signal Sup_Is is in the range between 1.8V and 3.3V. That is, the high voltage level of the pull-up converted output signal is 3.3V, and the low voltage level of that is 1.8V.

The first inverter 412 is used for receiving the pull-up converted output signal Sup_Is and converting the pull-up converted output signal Sup_Is into the second P-type driving signal Sp2. The second P-type driving signal Sp2 is transmitted to the gate terminal of the second P-type transistor P2. The voltage level of the second P-type driving signal Sp2 is in the range between 1.8V and 3.3V. That is, the high voltage level of the second P-type driving signal is 3.3V, and the low voltage level of that is 1.8V.

The first timing matching circuit 414 is used for receiving the pull-up driving signal Sup, and generating a delayed pull-up driving signal Sup_d to the first transmission gate 413 and the pull-up transient path 415. The first transmission gate 413 has an input terminal electrically connected to the first bias voltage (e.g. the core voltage Vcore), and an output terminal for outputting the first P-type driving signal Sp1 to the gate terminal of the first P-type transistor P1. Moreover, the first transmission gate 413 has a first control terminal electrically connected to the driving stage output terminal Vout, and a second control terminal receiving the delayed pull-up driving signal Sup_d. The pull-up transient path 415 is electrically connected between the driving stage output terminal Vout and the gate terminal of the first P-type transistor P1. Moreover, the pull-up transient path 415 has a control terminal receiving the delayed pull-up driving signal Sup_d.

The first timing matching circuit 414 is used for adjusting the timing the first P-type driving signal Sp1 and the second P-type driving signal Sp2 generated by the pull-up driving unit 41. Consequently, the first P-type driving signal Sp1 and the second P-type driving signal Sp2 can be simultaneously propagated to the gate terminal of the first P-type transistor P1 and the gate terminal of the second P-type transistor P2, respectively. Alternatively, in some embodiments, the first timing matching circuit 414 is omitted, and the operations of the pull-up driving unit 41 are still normal.

Please refer to FIG. 5A again. The pull-up transient path 415 includes a third N-type transistor N3 and a fourth N-type transistor N4. The gate terminal of the third N-type transistor N3 is electrically connected to the first bias voltage (e.g. the core voltage Vcore). The gate terminal of the fourth N-type transistor N4 is served as the control terminal of the pull-up transient path 415, and receives the delayed pull-up driving signal Sup_d. In addition, the third N-type transistor N3 and the fourth N-type transistor N4 are serially electrically connected between the driving stage output terminal Vout and the gate terminal of the first P-type transistor P1.

The first transmission gate 413 includes a third P-type transistor P3 and a fifth N-type transistor N5. The source terminal of the third P-type transistor P3 and the drain terminal of the fifth N-type transistor N5 are collectively electrically connected as the input terminal of the first transmission gate 413, and electrically connected to the first bias voltage. The drain terminal of the third P-type transistor P3 and the source terminal of the fifth N-type transistor N5 are collectively electrically connected as the output terminal of the first transmission gate 413, and electrically connected to the gate terminal of the first P-type transistor P1. The gate terminal of the fifth N-type transistor N5 is served as the first control terminal of the first transmission gate 413. In addition, the gate terminal of the fifth N-type transistor N5 is electrically connected to the driving stage output terminal Vout. The gate terminal of the third P-type transistor P3 is served as the second control terminal of the first transmission gate 413, and receives the delayed pull-up driving signal Sup_d.

It is noted that numerous modifications and alterations of the first level shifter 411 may be made while retaining the teachings of the invention. Moreover, since the first timing matching circuit 414 is only used for delaying signals, the detailed circuitry thereof is not redundantly described herein.

Figure 5B:
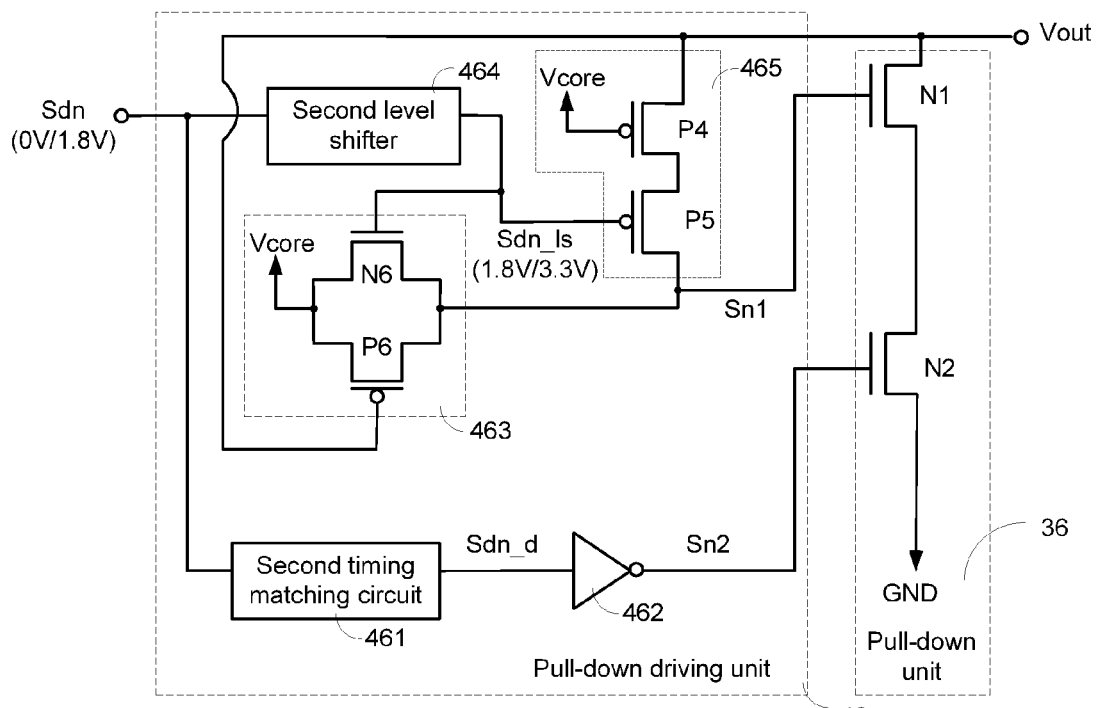
FIG. 5B is a schematic circuit diagram illustrating the pull-down driving unit and the pull-down unit of a DC converter according to an embodiment of the present invention.

FIG. 5B is a schematic circuit diagram illustrating the pull-down driving unit and the pull-down unit of a DC converter according to an embodiment of the present invention. As shown in FIG. 5B, the pull-down driving unit 46 includes a second level shifter 464, a second inverter 462, a second transmission gate 463, a second timing matching circuit 461, and a pull-down transient path 465.

The second level shifter 464 is used for receiving a pull-down driving signal Sdn, which is generated according to the control signal Sc. The voltage level of the pull-down driving signal Sdn is 0V or 1.8V. By the second level shifter 464, the pull-down driving signal Sdn is converted into a pull-down converted output signal Sdn_Is. The pull-down converted output signal Sdn_Is is in the range between 1.8V and 3.3V. That is, the high voltage level of the pull-down converted output signal Sdn_Is is 3.3V, and the low voltage level of that is 1.8V.

The second timing matching circuit 461 is used for receiving the pull-down driving signal Sdn, and generating a delayed pull-down driving signal Sdn_d.

The second inverter 462 is used for receiving the delayed pull-down driving signal Sdn_d and converting the delayed pull-down driving signal Sdn_d into the second N-type driving signal Sn2. The voltage level of the second N-type driving signal Sn2 is in the range between 1.8V and 3.3V. That is, the high voltage level of the second N-type driving signal Sn2 is 3.3V, and the low voltage level of that is 1.8V.

The second transmission gate 463 has an input terminal electrically connected to the first bias voltage (e.g. the core voltage Vcore), and an output terminal for outputting the first N-type driving signal Sn1 to the gate terminal of the first N-type transistor N1. Moreover, the second transmission gate 463 has a first control terminal electrically connected to the driving stage output terminal Vout, and a second control terminal receiving the pull-down converted output signal Sdn_Is. The pull-down transient path 465 is electrically connected between the driving stage output terminal Vout and the gate terminal of the first N-type transistor N1. Moreover, the pull-down transient path 465 has a control terminal receiving the pull-down converted output signal Sdn_Is.

The second timing matching circuit 461 is used for adjusting the timing of generating the first N-type driving signal Sn1 and the second N-type driving signal Sn2 by the pull-down driving unit 46. Consequently, the first N-type driving signal Sn1 and the second N-type driving signal Sn2 can be simultaneously propagated to the gate terminal of the first N-type transistor N1 and the gate terminal of the second N-type transistor N2, respectively. Alternatively, in some embodiments, the second timing matching circuit 461 is omitted, and the operations of the pull-down driving unit 46 are still normal.

Please refer to FIG. 5B again. The pull-down transient path 465 includes a fourth P-type transistor P4 and a fifth N-type transistor P5. The gate terminal of the fourth P-type transistor P4 is electrically connected to the first bias voltage (e.g. the core voltage Vcore). The gate terminal of the fifth N-type transistor P5 is served as the control terminal of the pull-down transient path 465, and receives the pull-down converted output signal Sdn_Is. In addition, the fourth P-type transistor P4 and the fifth N-type transistor P5 are serially electrically connected between the driving stage output terminal Vout, and the gate terminal of the first N-type transistor N1.

The second transmission gate 463 includes a sixth P-type transistor P6 and a sixth N-type transistor N6. The source terminal of the sixth P-type transistor P6 and the drain terminal of the sixth N-type transistor N6 are collectively electrically connected as the input terminal of the second transmission gate 463, and electrically connected to the first bias voltage (e.g. the core voltage Vcore). The drain terminal of the sixth P-type transistor P6 and the source terminal of the sixth N-type transistor N6 are collectively electrically connected as the output terminal of the second transmission gate 463, and electrically connected to the gate terminal of the first N-type transistor N1. The gate terminal of the sixth N-type transistor N6 is served as the first control terminal of the second transmission gate 463, and receives the pull-down converted output signal Sdn_Is. The gate terminal of the sixth P-type transistor P6 is served as the second control terminal of the second transmission gate 463, and is electrically connected to the driving stage output terminal Vout.

It is noted that numerous modifications and alterations of the second level shifter 464 may be made while retaining the teachings of the invention. Moreover, since the second timing matching circuit 461 is only used for delaying signals, the detailed circuitry thereof is not redundantly described herein.

Please refer to FIGS. 5A and 5B again. The pull-up unit 31 and the pull-down unit 36 are alternately turned on and turned off. That is, once the pull-up unit 31 is turned on, the pull-down unit 36 is turned off. Whereas, once the pull-up unit 31 is turned off, the pull-down unit 36 is turned on.

In a case that the pull-up driving signal Sup and the pull-down driving signal Sdn are both at the low voltage-level states (0V), the pull-up converted output signal Sup_Is of the pull-up driving unit 41 is at the low voltage-level state (1.8V), and the second P-type driving signal Sp2 generated by the first inverter 412 is at the high voltage-level state (3.3V). In addition, the delayed pull-up driving signal Sup_d is at the low voltage-level state (0V). In the pull-down driving unit 46, the delayed pull-down driving signal Sdn_d generated by the second timing matching circuit 461 is at the low voltage-level state (0V), and the second N-type driving signal Sn2 generated by the second inverter 462 is at the high voltage-level state (1.8V).

Since the delayed pull-up driving signal Sup_d is at the low voltage-level state, the pull-up transient path 415 is turned off (or in the open state), and the first transmission gate 413 is in the close state. Meanwhile, the first P-type driving signal Sp1 is 1.8V. Under this circumstance, the second P-type transistor P2 is turned off, so that the pull-up unit 31 is turned off.

Moreover, since the pull-down converted output signal Sdn_Is is at the low voltage-level state, the pull-down transient path 465 is turned on (or in the close state), and the second transmission gate 463 is in the open state. Meanwhile, the first N-type driving signal Sn1 is equal to the first bias voltage (e.g. the core voltage Vcore). Under this circumstance, since the first N-type transistor N1 and the second N-type transistor N2 of the pull-down unit 36 are turned on, the pull-down unit 36 is turned on, and the driving stage output terminal Vout is at the low voltage level (0V).

During the beginning of a first transient period of switching the pull-up driving signal Sup and the pull-down driving signal Sdn from the low voltage-level state to the high voltage-level state, the delayed pull-down driving signal Sdn_d generated by the second timing matching circuit 461 is at the high voltage-level state (1.8V), and the second N-type driving signal Sn2 generated by the second inverter 462 is at the low voltage-level state (0V).

Moreover, since the pull-down converted output signal Sdn_Is generated by the second level shifter 464 is at the high voltage-level state (3.3V), the pull-down transient path 465 is turned off (or in the open state). Since the pull-down converted output signal Sdn_Is received by the gate terminal of the sixth N-type transistor N6 is at the high voltage-level state and the driving stage output terminal Vout received by the sixth P-type transistor P6 is at the low voltage level, the second transmission gate 463 is in the close state. Meanwhile, the first N-type driving signal Sn1 is equal to the first bias voltage (e.g. the core voltage Vcore). Under this circumstance, since the second N-type driving signal Sn2 is at the low voltage-level state, the second N-type transistor N2 of the pull-down unit 36 is turned off, and the pull-down unit 36 is turned off.

Moreover, in the pull-up driving unit 41, the pull-up converted output signal Sup_Is generated by the first level shifter 411 is at the high voltage-level state (3.3V), and the second P-type driving signal Sp2 generated by the first inverter 412 is at the low voltage-level state (1.8V). In addition, the delayed pull-up driving signal Sup_d is at the high voltage-level state (1.8V). Since the gate terminal of the third P-type transistor P3 is at the high voltage-level state, the third P-type transistor P3 is turned off, and the first transmission gate 413 is in the open state.

On the other hand, since the delayed pull-up driving signal Sup_d is at the high voltage-level state, the fourth N-type transistor N4 is turned on, and the pull-up transient path 415 is turned on. Consequently, during the first transient period, the first P-type driving signal Sp1 is changed with the driving stage output terminal Vout. Under this circumstance, since the pull-up unit 31 is turned off, the driving stage output terminal Vout is gradually increased from the low voltage level (0V) to the high voltage level (3.3V).

Obviously, during the first transient period, the first P-type driving signal Sp1 is lower than the first bias voltage. Consequently, the first P-type transistor P1 has stronger pull-up strength. Under this circumstance, the drain voltage and the source voltage are substantially increased at the same speed. Since the voltage difference is not too large, the possibility of damaging the first P-type transistor P1 will be minimized.

During a first stable period after the first transient period of switching the pull-up driving signal Sup and the pull-down driving signal Sdn from the low voltage-level state to the high voltage-level state, the pull-down unit 36 is continuously turned off, and the operation thereof is not redundantly described herein. Meanwhile, the pull-up unit 31 is maintained at the on state. Moreover, during the first stable period, the second P-type driving signal Sp2 is continuously maintained at the low voltage-level state (1.8V), and the driving stage output terminal Vout is higher than 1.8V. Consequently, the pull-up transient path 415 is turned off (or in the open state). Since the fifth N-type transistor N5 is turned on, the first transmission gate 413 is in the close state. Consequently, the core voltage Vcore is transmitted to the first P-type transistor P1 through the fifth N-type transistor N5 to be served as the first P-type driving signal Sp1. Under this circumstance, the first P-type driving signal Sp1 is no longer changed with the driving stage output terminal Vout. That is, the first P-type driving signal Sp1 is maintained at the first bias voltage (e.g. the core voltage Vcore), and the driving stage output terminal Vout is at the high voltage-level state (3.3V).

During the beginning of a second transient period of switching the pull-up driving signal Sup and the pull-down driving signal Sdn from the high voltage-level state to the low voltage-level state, the pull-up converted output signal Sup_Is generated by the first level shifter 411 is at the low voltage-level state (1.8V), and the second P-type driving signal Sp2 generated by the first inverter 412 is at the high voltage-level state (3.3V).

Moreover, since the delayed pull-up driving signal Sup_d generated by the first timing matching circuit 414 is at the low voltage-level state (0V), the pull-up transient path 415 is turned off (or in the open state). Since the delayed pull-up driving signal Sup_d is received by the gate terminal of the third P-type transistor P3, the third P-type transistor P3 is turned on. Meanwhile, the first P-type driving signal Sp1 is equal to the first bias voltage (e.g. the core voltage Vcore), and the first transmission gate 413 is in the close state. Moreover, since the second P-type driving signal Sp2 is at the high voltage-level state (3.3V), the second P-type transistor P2 is turned off, and the pull-up unit 31 is turned off.

Moreover, the delayed pull-down driving signal Sdn_d generated by the second timing matching circuit 461 is at the low voltage-level state (0V), and the second N-type driving signal Sn2 generated by the second inverter 462 is at the high voltage-level state (1.8V). Consequently, the second N-type transistor N2 is turned on. Meanwhile, the pull-down converted output signal Sdn_Is is at the high voltage-level state (1.8V). Since the gate terminal of the sixth N-type transistor N6 is at the high voltage-level state, the second transmission gate 330 is in the open state. Moreover, during the second transient period, the pull-down transient path 465 is turned on. Consequently, the first N-type driving signal Sn1 is changed with the driving stage output terminal Vout. Since the pull-down unit 36 is turned on, the driving stage output terminal Vout is gradually decreased from the high voltage-level state (3.3V) to the low voltage-level state (0V).

Obviously, during the second transient period, the first N-type driving signal Sn1 is higher than the first bias voltage (e.g. the core voltage Vcore). Consequently, the first N-type transistor N1 has stronger pull-down strength. Under this circumstance, the drain voltage and the source voltage are increased at substantially the same speed. Since the voltage difference is not too large, the possibility of damaging the first N-type transistor N1 will be minimized.

It is noted that numerous modifications and alterations of the driving circuit may be made while retaining the teachings of the invention. For example, the driving circuit 40 may only include the pull-up driving unit 41, wherein the pull-down driving unit 46 is exempted. Alternatively, the driving circuit 40 may only include the pull-down driving unit 46, wherein the pull-up driving unit 41 is exempted.

In the above embodiments, the first P-type transistor P1 of the pull-up unit and the first N-type transistor N1 of the pull-down unit are selectively electrically connected to the driving stage output terminal Vout or the first bias voltage (e.g. the core voltage Vcore). When the pull-up unit or the pull-down unit is turned on, the gate voltage can provide sufficient pull-up strength or pull-down strength. Consequently, the possibility of damaging the first P-type transistor P1 or the first N-type transistor N1 will be minimized.

From the above description, the DC converter of the present invention is cost-effective because the driving stage of the DC converter is integrated into a chip. Moreover, since the conventional power MOS is replaced by the two low voltage-stress MOS transistors in a cascode configuration, the switching response is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A DC converter for converting a first supply voltage into a second supply voltage, the first supply voltage being higher than the second supply voltage, the DC converter comprising:
a driving stage comprising a modulation circuit, a pull-up driving unit, and a pull-up unit, wherein the modulation circuit generates a control signal according to the second supply voltage, the pull-up driving unit generates a first P-type driving signal and a second P-type driving signal according to the control signal, and the pull-up unit comprises a first P-type transistor and a second P-type transistor, wherein the second P-type transistor has a source terminal electrically connected to the first supply voltage, and a gate terminal receiving the second P-type driving signal, wherein the first P-type transistor has a source terminal electrically connected to a drain terminal of the second P-type transistor, a gate terminal receiving the first P-type driving signal, and a drain terminal electrically connected to a driving stage output terminal; and
an output stage for generating the second supply voltage according to an output voltage of the driving stage output terminal,
wherein during a transient period of switching the output voltage of the driving stage output terminal from a third supply voltage to the first supply voltage, the first P-type driving signal is decreased from a first bias voltage to a second bias voltage, wherein during a stable period after the transient period, the first P-type driving signal is restored to the first bias voltage.

2. The DC converter as claimed in claim 1, wherein the first supply voltage is an input/output voltage, the second supply voltage is a core voltage, the third supply voltage is a ground voltage, the first bias voltage is equal to the core voltage, and the second bias voltage is equal to the ground voltage.

3. The DC converter as claimed in claim 1, wherein before the transient period, the first P-type driving signal is maintained at the first bias voltage, and the second P-type driving signal is at a high logic-level state, so that the pull-up unit is turned off.

4. The DC converter as claimed in claim 1, wherein during the transient period, the first P-type driving signal is equal to the output voltage of the driving stage output terminal.

5. The DC converter as claimed in claim 1, wherein the modulation circuit comprises:
    a voltage divider for generating a divided voltage according to the second supply voltage; and
    a feedback pulse width modulation controller for generating the control signal according to the divided voltage.

6. The DC converter as claimed in claim 1, wherein the output voltage comprises:
    an inductor having a first end electrically connected to the driving stage output terminal and a second end generating the second supply voltage; and
    a capacitor electrically connected between the second end of the inductor and a ground voltage.

7. The DC converter as claimed in claim 1, wherein the driving stage is integrated into a system on chip for receiving the first supply voltage, the output voltage is externally electrically connected to the system on chip through the driving stage output terminal for generating the second supply voltage, wherein the first supply voltage is further received by an input/output circuit of the system on chip, and the second supply voltage is further received by a core circuit of the system on chip.

8. A DC converter for converting a first supply voltage into a second supply voltage, the first supply voltage being higher than the second supply voltage, the DC converter comprising:
    a driving stage comprising a modulation circuit, a pull-down driving unit, and a pull-down unit, wherein the modulation circuit generates a control signal according to the second supply voltage, the pull-down driving unit generates a first N-type driving signal and a second N-type driving signal according to the control signal, and the pull-down unit comprises a first N-type transistor and a second N-type transistor, wherein the second N-type transistor has a source terminal electrically connected to a third supply voltage, and a gate terminal receiving the second N-type driving signal, wherein the first N-type transistor has a source terminal electrically connected to a drain terminal of the second N-type transistor, a gate terminal receiving the first N-type driving signal, and a drain terminal electrically connected to a driving stage output terminal;
    an output stage for generating the second supply voltage according to an output voltage of the driving stage output terminal,
    wherein during a transient period of switching the output voltage of the driving stage output terminal from the first supply voltage to the third supply voltage, the first N-type driving signal is increased from a first bias voltage to a third bias voltage, wherein during a stable period after the transient period, the first N-type driving signal is restored to the first bias voltage.

9. The DC converter as claimed in claim 8, wherein the first supply voltage is an input/output voltage, the second supply voltage is a core voltage, the third supply voltage is a ground voltage, the first bias voltage is equal to the core voltage, and the third bias voltage is equal to the input/output voltage.

10. The DC converter as claimed in claim 8, wherein before the transient period, the first N-type driving signal is maintained at the first bias voltage, and the second N-type driving signal is at a low logic-level state, so that the pull-down unit is turned off.

11. The DC converter as claimed in claim 8, wherein during the transient period, the first N-type driving signal is equal to the output voltage of the driving stage output terminal.

12. The DC converter as claimed in claim 8, wherein the modulation circuit comprises:
    a voltage divider for generating a divided voltage according to the second supply voltage; and
    a feedback pulse width modulation controller for generating the control signal according to the divided voltage.

13. The DC converter as claimed in claim 8, wherein the output voltage comprises:
    an inductor having a first end electrically connected to the driving stage output terminal and a second end generating the second supply voltage; and
    a capacitor electrically connected between the second end of the inductor and a ground voltage.

14. The DC converter as claimed in claim 8, wherein the driving stage is integrated into a system on chip for receiving the first supply voltage, the output voltage is externally electrically connected to the system on chip through the driving stage output terminal for generating the second supply voltage, wherein the first supply voltage is further received by an input/output circuit of the system on chip, and the second supply voltage is further received by a core circuit of the system on chip.

* * * * *